(12) United States Patent
Tachino et al.

(10) Patent No.: US 11,802,793 B2
(45) Date of Patent: Oct. 31, 2023

(54) OPTICAL DETECTOR AND METHOD FOR CONTROLLING THE SAME

(71) Applicant: DENSO CORPORATION, Kariya (JP)

(72) Inventors: Yoshihide Tachino, Kariya (JP); Isamu Takai, Kariya (JP)

(73) Assignee: DENSO CORPORATION, Kariya (JP)

( * ) Notice: Subject to any disclaimer, the term of this patent is extended or adjusted under 35 U.S.C. 154(b) by 159 days.

(21) Appl. No.: 16/952,611

(22) Filed: Nov. 19, 2020

(65) Prior Publication Data

US 2021/0072076 A1    Mar. 11, 2021

Related U.S. Application Data

(63) Continuation of application No. PCT/JP2019/019553, filed on May 16, 2019.

(30) Foreign Application Priority Data

May 22, 2018   (JP) ................. 2018-097736

(51) Int. Cl.
*G01J 1/44*   (2006.01)
(52) U.S. Cl.
CPC ........... *G01J 1/44* (2013.01); *G01J 2001/442* (2013.01); *G01J 2001/4466* (2013.01)

(58) Field of Classification Search
CPC . G01J 1/44; G01J 2001/442; G01J 2001/4466
See application file for complete search history.

(56) References Cited

U.S. PATENT DOCUMENTS

2019/0189827 A1\* 6/2019 Haraguchi ........... H04N 5/3698

FOREIGN PATENT DOCUMENTS

| JP | 5644294 B2 | 12/2014 |
| JP | 2016-176750 A | 10/2016 |

\* cited by examiner

*Primary Examiner* — Thanh Luu
(74) *Attorney, Agent, or Firm* — MASCHOFF BRENNAN

(57) ABSTRACT

An optical detector includes: a light-receiving element that is operated in a Geiger mode by application of a service voltage higher than a breakdown voltage and outputs a pulse signal in accordance with reception of light; a voltage setting unit that is capable of selectively applying any one of the service voltage and a test voltage lower than the breakdown voltage to the light-receiving element; and an abnormality determination unit that performs an abnormality determination process of determining that the light-receiving element is abnormal when the number of pulse signals output from the light-receiving element operated under the test voltage is equal to or greater than a predetermined threshold, and determining that the light-receiving element is normal when the number of pulse signals is smaller than the threshold.

7 Claims, 8 Drawing Sheets

OPTICAL DETECTOR AND METHOD FOR CONTROLLING THE SAME

CROSS-REFERENCE TO RELATED APPLICATION

This application is the U.S. bypass application of International Application No. PCT/JP2019/019553 filed on May 16, 2019 which designated the U.S. and claims priority to Japanese Patent Application 2018-97736 filed on May 22, 2018, the contents of both of which are incorporated herein by reference.

TECHNICAL FIELD

The present disclosure relates to an optical detector.

BACKGROUND

Japanese Patent No. 5644294 discloses an optical detector using single-photon avalanche diodes (SPADs) operating in a Geiger mode. The optical detector is mounted on an optical distance meter, for example, for the purpose of measuring the distance to a target object based on the time of flight (TOF) of received light.

SUMMARY

According to an aspect of the present disclosure, there is provided an optical detector. This optical detector includes: a light-receiving element that is operated in a Geiger mode by application of a service voltage higher than a predetermined breakdown voltage and outputs a pulse signal in accordance with reception of light; a voltage setting unit that is capable of selectively applying any one of the service voltage and a test voltage lower than the breakdown voltage to the light-receiving element; and an abnormality determination unit that performs an abnormality determination process of determining that the light-receiving element is abnormal when the number of pulse signals output from the light-receiving element operated under the test voltage is equal to or greater than a predetermined threshold, and determining that the light-receiving element is normal when the number of pulse signals is smaller than the threshold.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

It is known that such an optical detector disclosed in Japanese Patent No. 5644294 suffers aging degradation resulting from an internal defect of a semiconductor. As the time degradation proceeds, dark current flowing irrelevant to the receipt of light increases and this may cause a failure of the optical detector. Thus, there is a demand for a technique with which the presence or absence of an abnormality in an optical detector can be easily determined.

The present disclosure can be carried out in an aspect described below.

According to an aspect of the present disclosure, there is provided an optical detector. This optical detector includes: a light-receiving element that is operated in a Geiger mode by application of a service voltage higher than a predetermined breakdown voltage and outputs a pulse signal in accordance with reception of light; a voltage setting unit that is capable of selectively applying any one of the service voltage and a test voltage lower than the breakdown voltage to the light-receiving element; and an abnormality determination unit that performs an abnormality determination process of determining that the light-receiving element is abnormal when the number of pulse signals output from the light-receiving element operated under the test voltage is equal to or greater than a predetermined threshold, and determining that the light-receiving element is normal when the number of pulse signals is smaller than the threshold.

According to the optical detector in this aspect, the presence or absence of an abnormality can be easily determined by simply changing the service voltage of the light-receiving element.

The present disclosure can also be carried out in various aspects other than an optical detector. For example, the present disclosure can be carried out in aspects such as a method for controlling an optical detector and a method for determining an abnormality in an optical detector.

Embodiments of the present disclosure will be described hereinafter with reference to the drawings.

A. First Embodiment

Figure 1:
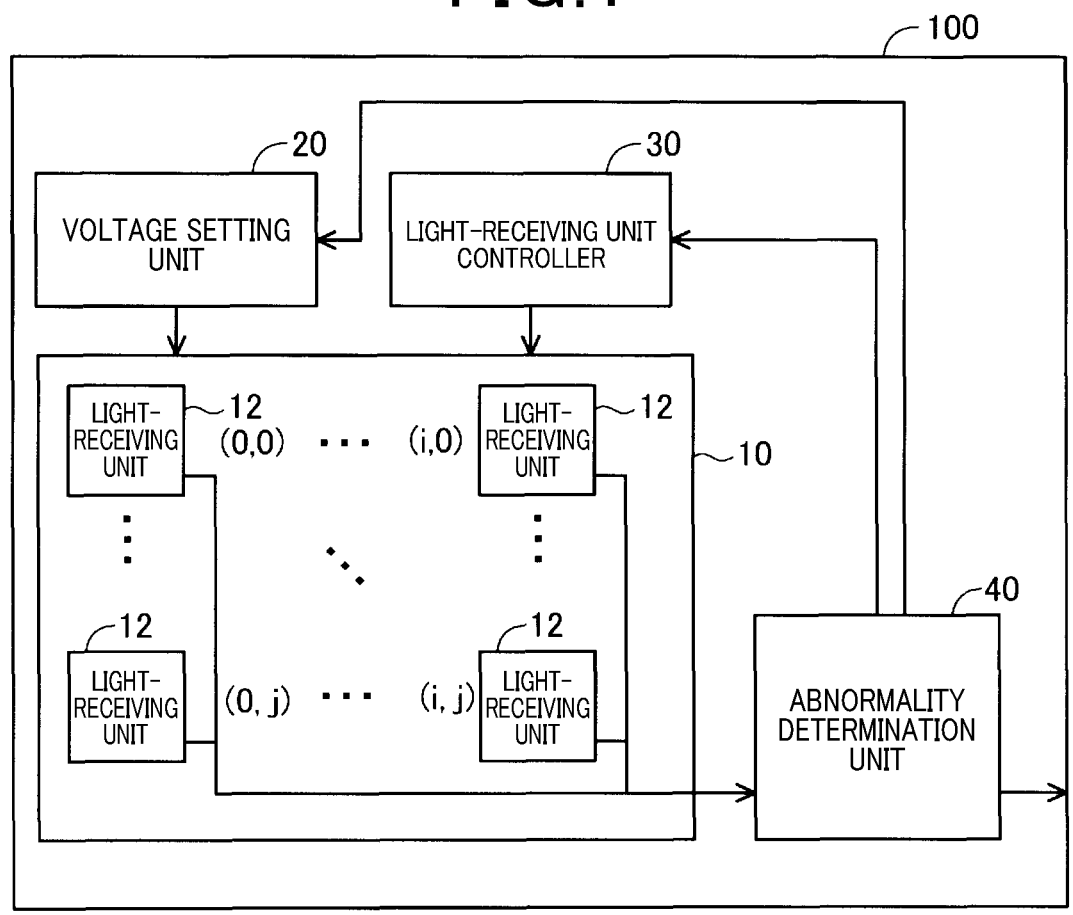
FIG. 1 is a diagram showing a schematic configuration of an optical detector in a first embodiment.

As shown in FIG. 1, an optical detector 100 as a first embodiment of the present disclosure includes a light-receiving device 10, a voltage setting unit 20, a light-receiving unit controller 30, and an abnormality determination unit 40. The voltage setting unit 20, the light-receiving unit controller 30, and the abnormality determination unit 40 may be formed by circuitry or may be implemented via software by a CPU, not shown, executing programs.

Figure 2:
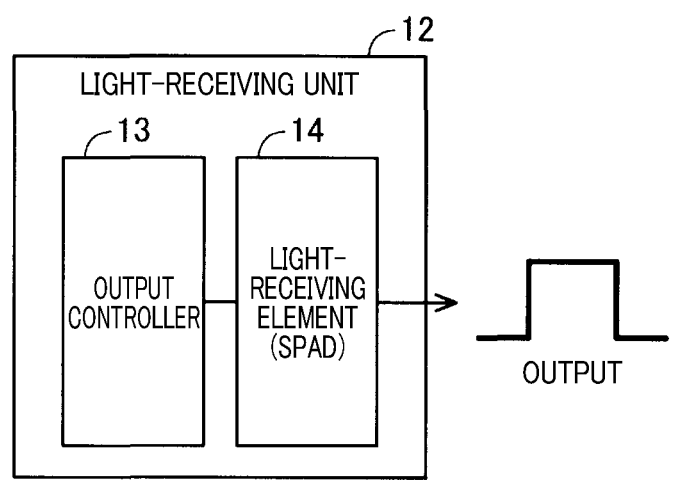
FIG. 2 is a diagram showing a schematic configuration of a light-receiving unit.
Figure 3:
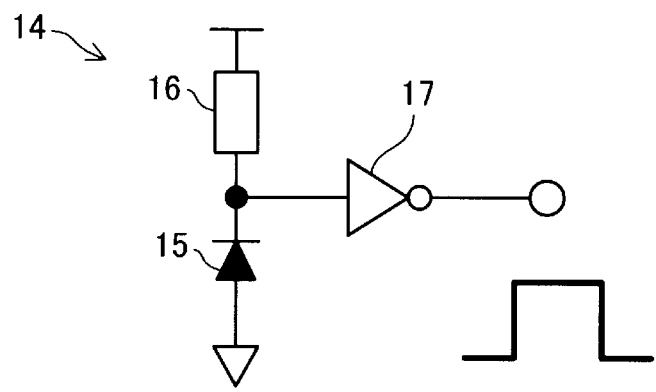
FIG. 3 is a diagram showing a schematic configuration of a light-receiving element.

The light-receiving device 10 includes a plurality of light-receiving units 12 in an array form. As shown in FIG. 2, each of the light-receiving units 12 includes an output controller 13 and a light-receiving element 14. In the present embodiment, as the light-receiving element 14, a single-photon avalanche diode (SPAD) is employed. As shown in FIG. 3, the light-receiving element (SPAD) 14 is formed of known circuitry including an avalanche diode (APD) 15, a quenching resistor 16, an inverter circuit (NOT circuit) 17, and the like. The light-receiving element 14 is operated in a Geiger mode by application of a service voltage higher than a predetermined breakdown voltage, and outputs a pulse signal in accordance with reception of light. The output controller 13 (FIG. 2) is a circuit for controlling the output of the light-receiving element 14.

The light-receiving device 10 (FIG. 1) has a function of adding up the number of pulse signals output from the light-receiving units 12 almost at the same time to determine a total value, and outputting the total value to the abnormality determination unit 40. For example, when the intensity of light received by the light-receiving device 10 is high, the number of pulse signals output from the plurality of light-receiving units 12 almost at the same time increases and the total value becomes larger. In contrast to this, when the intensity of light received by the light-receiving device 10 is low, the number of pulse signals output from the plurality of light-receiving units 12 almost at the same time decreases and the total value becomes smaller. The total value is output to an external device through the abnormality determination unit 40. The external device can detect the presence or absence of light received and measure the intensity of the light received in accordance with the total value output from the optical detector 100. The external device is an optical distance meter, for example. The optical distance meter records the total values output from the optical detector 100 at predetermined time intervals to generate a histogram, determines the time of flight (TOF) of the light based on the time of a peak of the histogram, and measures the distance to the target object.

The voltage setting unit 20 selectively applies either one of a service voltage and a test voltage to the light-receiving device 10. The test voltage is a voltage that is lower than a predetermined breakdown voltage and is a voltage used for determining the presence or absence of an abnormality in the light-receiving device 10. The relationship between the service voltage and the test voltage will be described later in detail. The voltage having been applied to the light-receiving device 10 is then applied to the light-receiving elements 14 through the output controllers 13 of the light-receiving units 12.

The light-receiving unit controller 30 controls the output controllers 13 included in the light-receiving units 12 to determine whether to apply a voltage to the light-receiving elements 14 of the light-receiving units 12, that is, whether to operate the light-receiving elements 14 of the light-receiving units 12.

The abnormality determination unit 40 executes an abnormality determination process of determining the presence or absence of an abnormality in the light-receiving device 10. In the abnormality determination process, the abnormality determination unit 40 operates the light-receiving element 14 under the test voltage described above, and determines that the light-receiving device 10 is abnormal when the number of pulse signals output from the light-receiving element 14, that is, the total value output from the light-receiving device 10 is equal to or greater than a predetermined determination threshold, and determines that the light-receiving device 10 is normal when the total value is smaller than a determination threshold. In the present embodiment, a value of 1 is used as the determination threshold. That is, the abnormality determination unit 40 in the present embodiment determines that the light-receiving device 10 is abnormal when even one pulse signal is output from the light-receiving element 14 operated under the test voltage. The determination threshold is not limited to 1 but may take a value of 2 or more, in consideration of the individual differences among the light-receiving elements 14.

Figure 4:
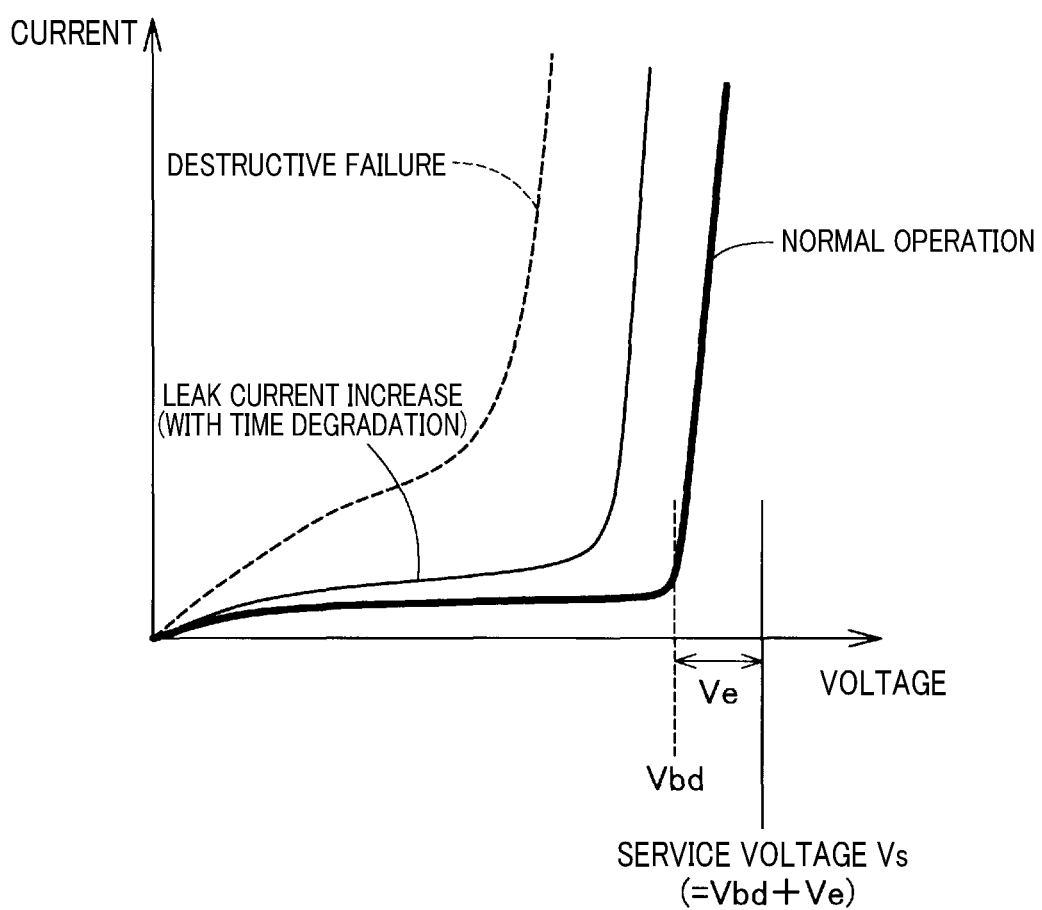
FIG. 4 is a first diagram for describing a principle of abnormality determination.
Figure 5:
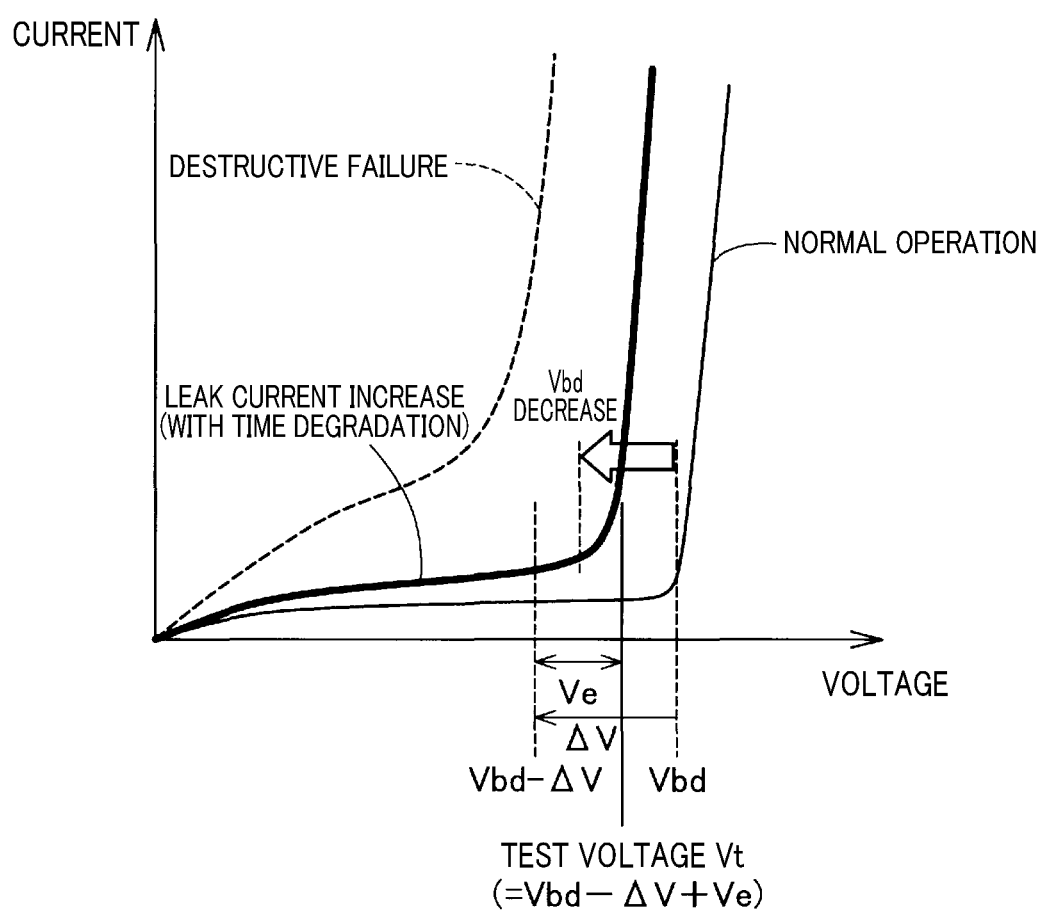
FIG. 5 is a second diagram for describing the principle of abnormality determination.

Hereinafter, the principle of the abnormality determination in the present embodiment will be described with reference to FIGS. 4 and 5. FIGS. 4 and 5 show V-I characteristics of the APD 15. During the normal operation of the light-receiving elements 14, the light-receiving element 14 is operated in the Geiger mode by application of a service voltage Vs (=Vbd+Ve) obtained by adding a predetermined excess voltage Ve to a predetermined breakdown voltage Vbd. The predetermined breakdown voltage Vbd means that the breakdown voltage Vbd is predetermined in accordance with a specification of the light-receiving element 14 based on the electrical characteristics of the APD 15. The excess voltage Ve is a voltage to be added to the breakdown voltage Vbd, and as its value becomes larger, the sensitivity of the light-receiving element 14 becomes higher. If such the light-receiving element 14 suffers time degradation resulting from an internal defect of the APD 15, dark current flowing regardless of reception of light increases, and along with this, the voltage under which a breakdown may occur gradually becomes lower. Then, as the time degradation of the light-receiving element 14 progresses, large dark current (leak current) flows irrespective of reception of light, which leads to a destructive failure (short circuit). Thus, in the present embodiment, in order to determine the time degradation of the light-receiving element 14, the voltage to be applied to the light-receiving element 14 is set to a test voltage Vt that is a voltage lower than the predetermined breakdown voltage Vbd as shown in FIG. 5. The test voltage Vt in the present embodiment is a voltage (Vt=Vbd−ΔV+Ve) obtained by subtracting a voltage ΔV larger than the excess voltage Ve from the predetermined breakdown voltage Vbd and adding the excess voltage Ve to the resultant voltage. Under the test voltage Vt, the light-receiving element 14 does not operate in the Geiger mode and thus does not output a pulse signal as far as the light-receiving element 14 is in the normal state without time degradation. In contrast to this, if the light-receiving element 14 suffers time degradation, the light-receiving element 14 is operated in the Geiger mode by application of the test voltage Vt, and thus the light-receiving element 14 can output a pulse signal. Due to its electrical characteristics, the light-receiving element 14 (SPAD) may cause a breakdown with a certain probability under influence of noise even if there is no reception of light. Therefore, if the light-receiving element 14 outputs a pulse signal during operation under the test voltage Vt, it can be determined that the light-receiving element 14 suffers time degradation irrespective of reception of light into the light-receiving element 14. The value of the voltage ΔV or the value of the test voltage Vt can be determined based on a voltage, determined in advance by experiment or calculation, under which a breakdown will occur in the light-receiving element 14 suffering time degradation but having not yet reached a destructive failure.

Figure 6:
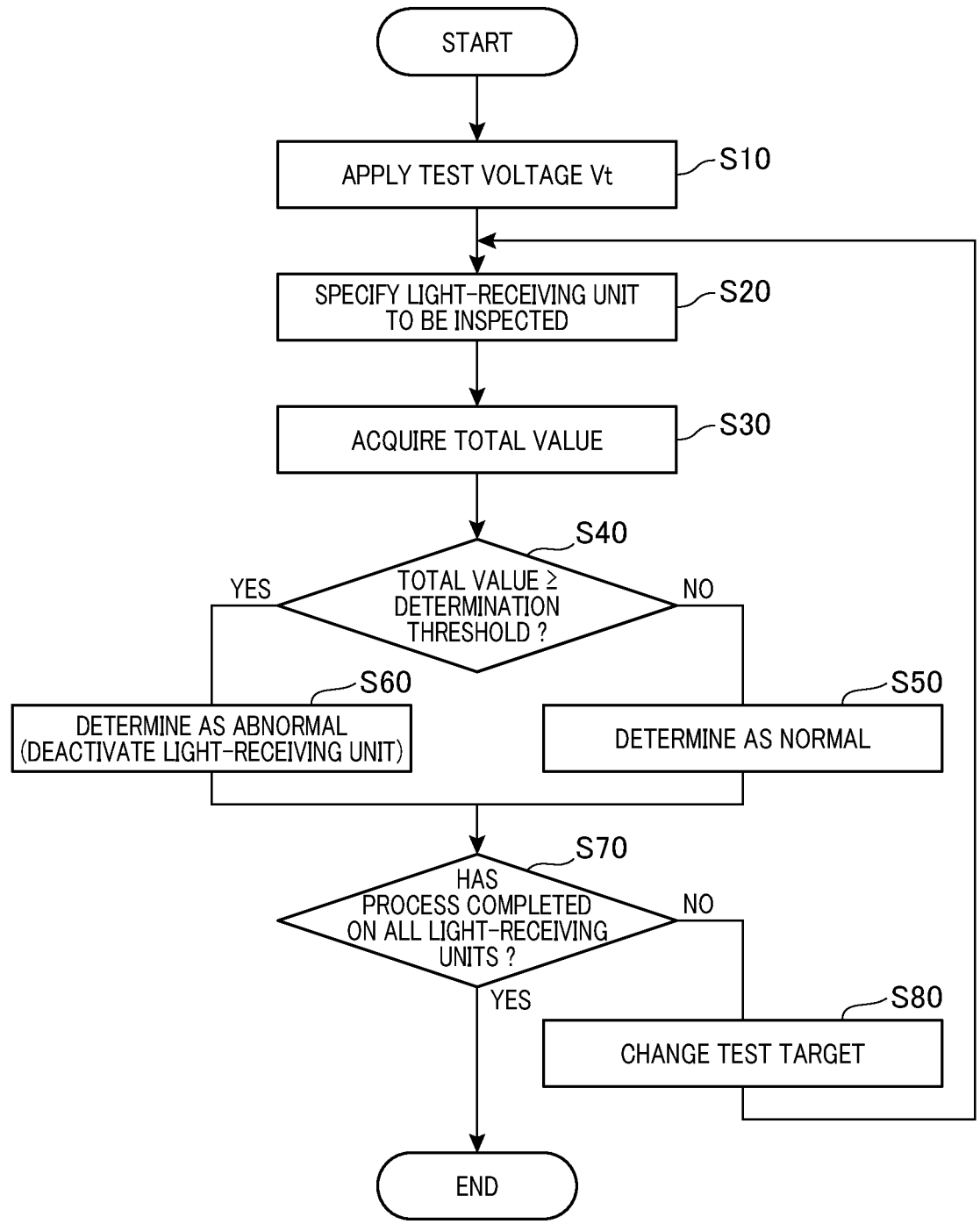
FIG. 6 is a flowchart of a process in the first embodiment.

FIG. 6 shows a flow of a process executed by the abnormality determination unit 40 in the optical detector 100. The process shown in FIG. 6 indicates a method for controlling the optical detector 100, which is executed at power-on of the optical detector 100 or upon receipt of a predetermined command from the outside. As shown in FIG. 6, the abnormality determination unit 40 first uses the voltage setting unit 20 to apply the test voltage Vt to the light-receiving device 10 (step S10).

Then, the abnormality determination unit 40 uses the light-receiving unit controller 30 to specify an address (i, j) of the light-receiving unit 12 to be tested (step S20). Upon receipt of specification of the address from the abnormality determination unit 40, the light-receiving unit controller 30 controls the output controllers 13 of the light-receiving units 12 to supply the test voltage Vt to only the light-receiving element 14 of the light-receiving unit 12 corresponding to the specified address.

The abnormality determination unit 40 acquires the total value from the light-receiving device 10 for a predetermined testing period (step S30). When no pulse signal is output from the light-receiving unit 12 to be tested, the abnormality determination unit 40 acquires the total value of zero. The abnormality determination unit 40 determines whether the total value acquired for the testing period is equal to or greater than a determination threshold ("1" in the present embodiment) (step S40). When the total value is less than the determination threshold (step S40: No), the abnormality determination unit 40 determines that the light-receiving unit 12 specified in step S20 is normal (step S50). In contrast to this, when the total value is equal to or greater than the determination threshold (step S40: Yes), the abnormality determination unit 40 determines that the light-receiving unit 12 specified in step S20 is abnormal (step S60). In the present embodiment, the abnormality determination unit 40 deactivates the light-receiving unit 12 that has been determined as abnormal. Specifically, the abnormality determination unit 40 uses the light-receiving unit controller 30 to control the output controller 13 of the light-receiving unit 12 having been determined as abnormal to reduce the service voltage to be applied to the corresponding light-receiving element 14 and keep it at zero, thereby deactivating the light-receiving unit 12.

After determining in step S50 that the light-receiving unit 12 is normal or determining in step S60 that the light-receiving unit 12 is abnormal, the abnormality determination unit 40 determines whether the abnormality determination has been performed on all the light-receiving units 12 (step S70). When abnormality determination has completed on all the light-receiving units 12 (step S70: Yes), the abnormality determination unit 40 terminates the process. On the other hand, when the abnormality determination has not yet completed on all the light-receiving units 12 (step S70: No), the abnormality determination unit 40 changes the address of the light-receiving unit 12 to be tested (step S80). Then, the abnormality determination unit 40 returns the process to step S20 to repeat the same steps as in the process described above on the remaining light-receiving units 12.

According to the optical detector 100 of the present embodiment described above, the presence or absence of an abnormality in the optical detector 100 can be easily determined only by changing the service voltage Vs of the light-receiving element 14 to the test voltage Vt. In the present disclosure, in particular, the test voltage Vt is set to a voltage lower than the predetermined breakdown voltage Vbd, and thus the light-receiving element 14 in the normal state does not output a pulse signal associated with light receipt or a pulse signal resulting from noise. Thus, regardless whether the optical detector 100 is installed in a light-receivable environment, it is possible to determine the presence or absence of an abnormality with high accuracy in any environment.

In the present embodiment, the light-receiving element 14 having been determined as abnormal is deactivated by decreasing its service voltage. This makes it possible to suppress failure and malfunction of the entire optical detector 100 from occurring due to breakdown of the light-receiving element 14.

In the present embodiment, the presence or absence of an abnormality in each light-receiving unit 12 is determined and thus only the abnormal light-receiving element 14 can be deactivated. This makes it possible to lengthen the lifetime of the optical detector 100.

B. Second Embodiment

Figure 7:
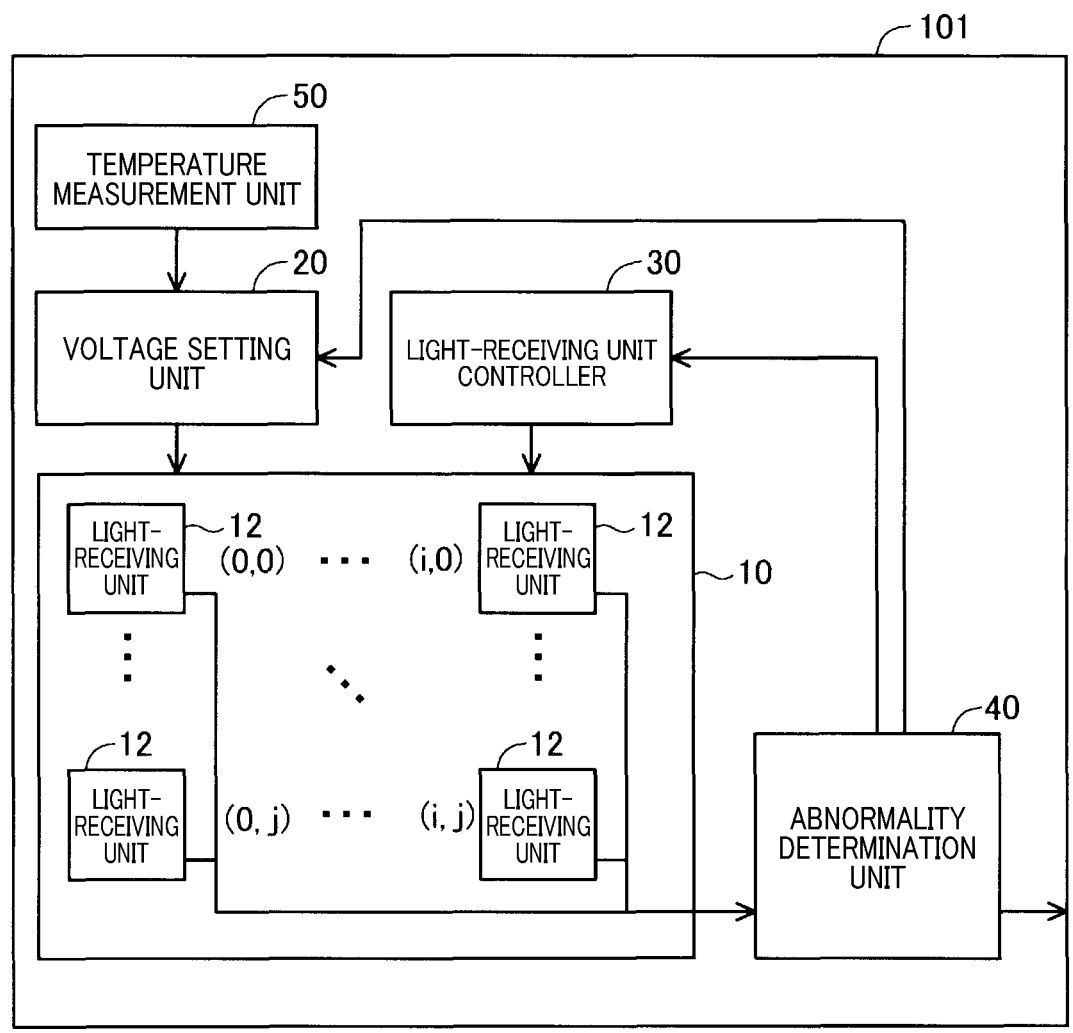
FIG. 7 is a diagram showing a schematic configuration of an optical detector in a second embodiment.

As shown FIG. 7, an optical detector 101 as a second embodiment of the present disclosure includes a temperature measurement unit 50. The temperature measurement unit 50 is formed of an IC temperature sensor, for example. Other components of the optical detector 101 are the same as those of the optical detector 100 of the first embodiment shown in FIG. 1. The temperature measurement unit 50 is connected to a voltage setting unit 20. The voltage setting unit 20 in the present embodiment has a function of changing a test voltage to be applied to a light-receiving device 10 in accordance with an environmental temperature measured by the temperature measurement unit 50.

Figure 8:
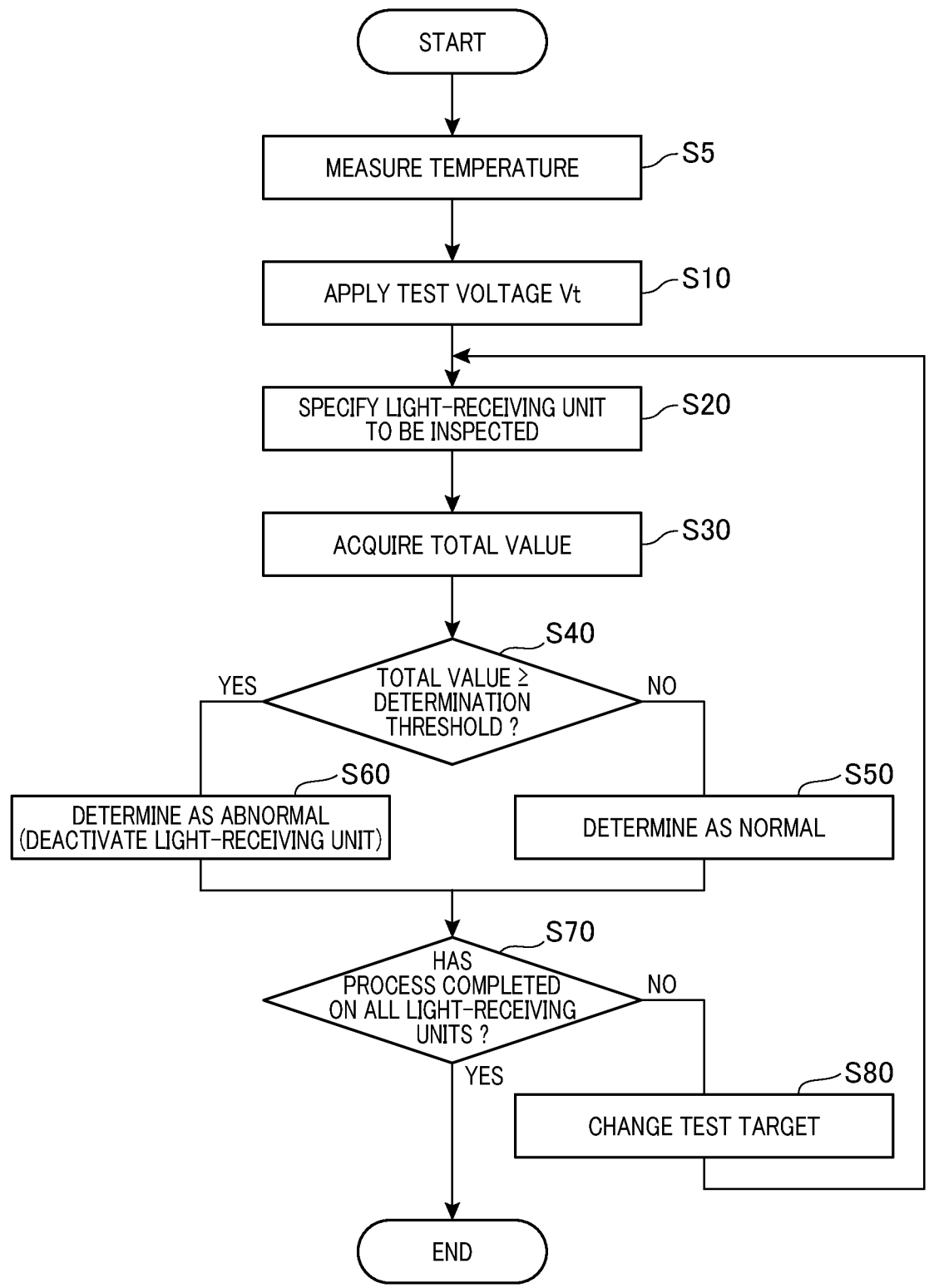
FIG. 8 is a flowchart of a process in the second embodiment.
Figure 9:
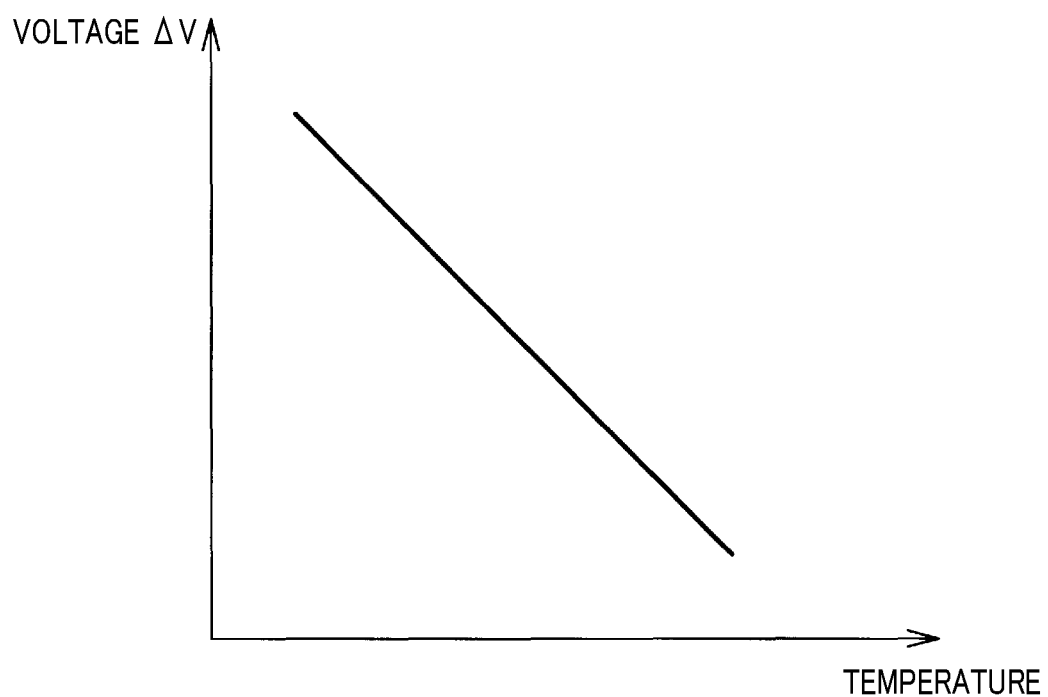
FIG. 9 is a graph showing a relationship between temperature and voltage.

As shown in FIG. 8, in the present embodiment as well, an abnormality determination unit 40 executes a process similar to the process shown in FIG. 6. In the present embodiment, however, prior to application of the test voltage to the light-receiving device 10 (step S10), the voltage setting unit 20 measures the environmental temperature by the use of the temperature measurement unit 50 (step S5), and sets a test voltage Vt to be applied to the light-receiving device 10 in step S10 in accordance with that temperature. In the present embodiment, as shown in FIG. 9, the voltage setting unit 20 decreases a voltage ΔV (see FIG. 5) as the measured environmental temperature becomes higher. Accordingly, the higher the environmental temperature, the higher the test voltage Vt (=Vbd−ΔV+Ve) becomes. Thus, even if the voltage under which a breakdown would occur in the light-receiving element 14 becomes larger as the environmental temperature becomes higher due to the temperature dependence characteristics of the light-receiving element 14, the test voltage Vt can be made higher along with that voltage increase. Consequently, abnormality determination can be accurately performed even with a change in the environmental temperature. The voltage setting unit 20 may adjust the test voltage Vt itself, not the voltage ΔV, in accordance with the environmental temperature.

The temperature measurement unit 50 is not limited to an IC temperature sensor but can be formed by using some of the light-receiving elements 14 included in the light-receiving device 10 as diode temperature sensors, for example.

In the present embodiment, the voltage setting unit 20 changes the test voltage Vt in accordance with the environmental temperature measured by the temperature measurement unit 50. However, for example, the voltage setting unit 20 may not change the test voltage Vt but the abnormality determination unit 40 may change the determination threshold in accordance with the temperature measured by the temperature measurement unit 50. In this way, even if the voltage under which a breakdown would occur in the light-receiving element 14 becomes smaller due to decrease in the environmental temperature and the light-receiving element 14 becomes more likely to output a pulse signal at the time of application of the test voltage Vt, the presence or absence of an abnormality in the light-receiving element 14 can be properly determined by setting the determination threshold to a larger value in accordance with decrease in the temperature.

Both the test voltage Vt and the determination threshold can be changed in accordance with the environmental temperature measured by the temperature measurement unit 50. In this case, as the environmental temperature becomes higher, the test voltage Vt is made higher and the determination threshold is also made larger. In general, when the environmental temperature increases, not only the voltage under which to breakdown would occur in the light-receiving element 14 becomes larger but also variation in the voltage becomes larger, and further dark current increases. Therefore, with a rise in the environmental temperature, the light-receiving element 14 becomes more likely to output a pulse signal. Thus, as the environmental temperature becomes higher, increasing both the test voltage Vt and the determination threshold makes it possible to properly determine the presence or absence of an abnormality in the light-receiving element 14.

C. Third Embodiment

A configuration of an optical detector 100 as a third embodiment of the present disclosure is similar to that of the optical detector 100 in the first embodiment shown in FIG. 1. However, an abnormality determination unit 40 in the third embodiment is configured to measure an operating time of a light-receiving element 14. The operating time of the light-receiving element 14 refers to an accumulative time during which a service voltage Vs is applied to the light-receiving element 14.

The light-receiving element 14 may have a breakdown voltage shifting to the positive or negative direction over time due to not only an internal defect of the APD 15 but also an interface trap or the like of a positive carrier or a negative carrier. Which of the positive and negative carriers is likely to be trapped depends on the physical properties of the APD 15 (materials of the insulating film and the element separation film.) Thus, in the case of employing the APD 15 that has a breakdown voltage becoming higher with an increase in the operating time of the light-receiving element 14, the voltage setting unit 20 increases the test voltage Vt with an increase in the operating time of the light-receiving element 14. In reverse, in the case of employing the APD 15 that has a breakdown voltage becoming smaller with an increase in the operating time of the light-receiving element 14, the voltage setting unit 20 decreases the test voltage Vt with an increase in the operating time of the light-receiving element 14. In this way, changing the test voltage Vt in accordance with the operating time of the light-receiving element 14 makes it possible to more properly determine the presence or absence of an abnormality in the light-receiving element 14. The amount of changing the test voltage Vt can be changed by the use of a function or a map so as to follow the amount of a change in the breakdown voltage of the APD 15 that is measured in advance in accordance with the operating time.

As described above, in the present embodiment, the test voltage Vt is changed in accordance with the operating time of the light-receiving element 14. In addition, the determination threshold may be changed in accordance with the operating time of the light-receiving element 14. For example, in the case of employing the APD 15 that has a breakdown voltage becoming larger with an increase in the operating time of the light-receiving element 14, the light-receiving element 14 becomes more likely to output a pulse signal with an increase in the breakdown voltage as described above. Thus, the abnormality determination unit 40 increases the determination threshold with an increase in the operating time of the light-receiving element 14. In reverse, in the case of employing the APD 15 that has a breakdown voltage becoming lower with an increase in the operating time of the light-receiving element 14, the abnormality determination unit 40 decreases the determination threshold with an increase in the operating time of the light-receiving element 14. In this way, changing the test voltage Vt in accordance with the operating time of the light-receiving element 14 makes it possible to more properly detect the presence or absence of an abnormality in the light-receiving element 14. The amount of changing the determination threshold can be changed by the use of a function or a map so as to follow the amount of a change in the breakdown voltage of the APD 15 that is measured in advance in accordance with the operating time.

D. Other Embodiments (D-1) In the foregoing embodiments, when it is determined that any light-receiving element 14 is abnormal, the light-receiving element 14 is deactivated by decreasing the service voltage to be applied to the light-receiving element 14 (more specifically, the quenching resistor 16) to zero. Otherwise, the light-receiving element 14 may be deactivated by connecting a switch to the output of the light-receiving element 14 (more specifically, the inverter circuit 17) and forcibly turning off the output of the light-receiving element 14 by the switch. Besides, the light-receiving element 14 may be deactivated by providing a switch between the light-receiving element 14 (more specifically, the APD 15) and the ground, for example, and turning the switch off.

(D-2) In the foregoing embodiments, when it is determined that any light-receiving element 14 is abnormal, the light-receiving element 14 having been determined as abnormal is deactivated. Otherwise, when it is determined that the light-receiving element 14 is abnormal, the light-receiving unit 12, 121 including the light-receiving element 14 or the optical detector 100, 101 including the light-receiving element 14 may be deactivated. That is, "deactivating the light-receiving element 14" means deactivating the light-receiving unit 12, 121 including the light-receiving element 14 or the optical detector 100, 101 including the light-receiving element 14. The deactivation of the light-receiving unit 12, 121 or the optical detector 100, 101 can be carried out by, for example, turning off power supply to these devices or turning off switches connected to the outputs of these devices.

(D-3) In the foregoing embodiments, when it is determined that any light-receiving element 14 is abnormal, the light-receiving element 14 is deactivated. Otherwise, when it is determined that the light-receiving element 14 is abnormal, the sensitivity of the light-receiving element 14 may be decreased. Decreasing the sensitivity of the light-receiving element 14 would allow the light-receiving element 14 to be normally used depending on the degree of degradation of the light-receiving element 14. Specifically, for example, the sensitivity of the light-receiving element 14 can be decreased by the abnormality determination unit 40 controlling the output controller 13 to decrease the excess voltage to be applied to the light-receiving element 14 having been determined as abnormal. Besides, the quenching resistor 16 may be formed as a variable resistor and the abnormality determination unit 40 may increase the resistance value of the quenching resistor 16 included in the light-receiving element 14 having been determined as abnormal. When the resistance value of the quenching resistor 16 is increased, the time from the instance immediately after the optical response to the instance when the voltage of the APD 15 is restored becomes longer, thereby bringing the light-receiving element 14 into a state that is substantially lower in sensitivity than the other light-receiving elements 14. In addition, the light-receiving element 14 having been determined as abnormal may be masked with a filter or the like with low light transmittance so that light is less likely to be applied to the APD 15. Masking the APD 15 decreases the frequency of response of the APD 15, which makes it possible to bring the light-receiving element 14 into a state that is substantially lower in sensitivity than the other light-receiving elements 14.

(D-4) In the foregoing embodiments, the light-receiving device 10 includes the plurality of light-receiving units 12. Otherwise, the light-receiving device 10 may include only one light-receiving unit 12. That is, the optical detector 100 may include only one light-receiving element 14. Even in this configuration, it is possible to determine the presence or absence of an abnormality in the light-receiving element 14 based on whether the number of pulse signals output from the light-receiving element 14 operated under the test voltage Vt is equal to or greater than the predetermined determination threshold (a value of 1).

Figure 10:
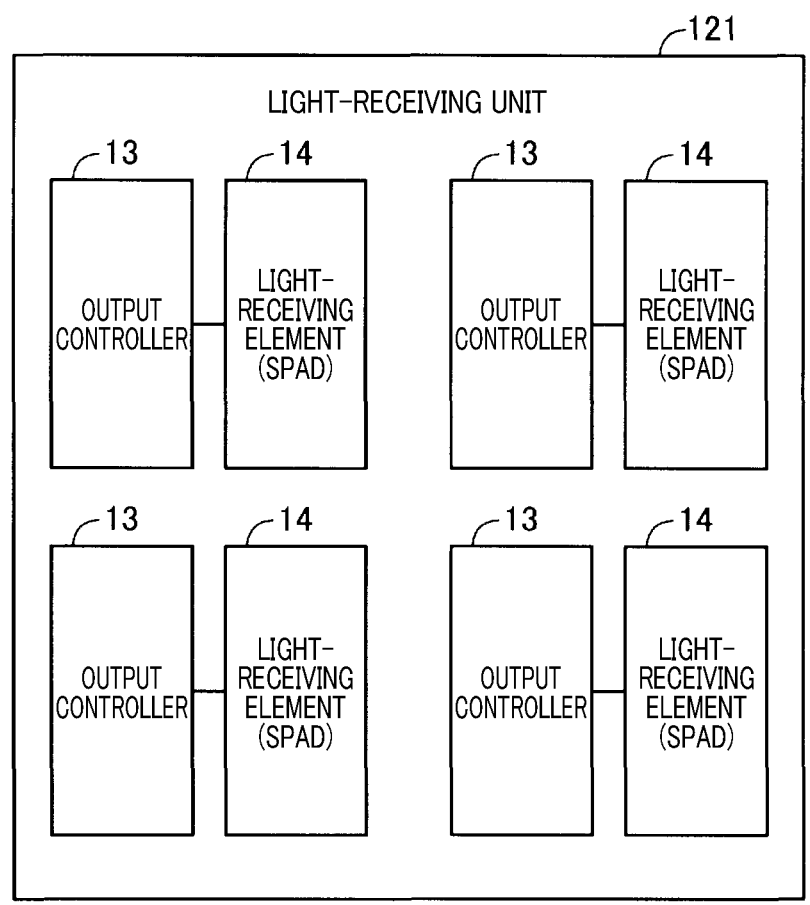
FIG. 10 is a diagram showing a schematic configuration of a light-receiving unit having a plurality of light-receiving elements.

(D-5) In the present embodiment, the light-receiving units 12 each have one light-receiving element 14. Otherwise, the light-receiving units 121 may each have a plurality of light-receiving elements 14 as shown in FIG. 10. In this case, the abnormality determination unit 40 determines the presence or absence of an abnormality in each of the light-receiving units 121. This makes it possible to complete the abnormality determination process on the light-receiving device 10 in a short time.

(D-6) As described above, in the case of determining the presence or absence of an abnormality in each of the light-receiving units 121 including the plurality of light-receiving elements 14, the abnormality determination unit 40 may further perform the abnormality determination process on the individual light-receiving elements 14 included in the light-receiving unit 121 that has been determined as abnormal. Performing the abnormality determination process stepwise as described above makes it possible to identify the abnormal light-receiving element 14 in a short time.

The present disclosure is not limited to the foregoing embodiments but can be implemented in various configurations without deviating from the scope of the present disclosure. For example, technical features in the embodiments can be replaced or combined with each other as appropriate to solve some or all of the foregoing issues or to attain some or all of the foregoing advantageous effects. In addition, technical features can be deleted as appropriate unless they are described as essential herein.

What is claimed is:

1. An optical detector comprising:
a light-receiving element that is operated in a Geiger mode by application of a service voltage higher than a predetermined breakdown voltage and outputs a pulse signal in accordance with reception of light;
a voltage setting unit that is capable of selectively applying any one of the service voltage and a test voltage lower than the breakdown voltage to the light-receiving element; and
an abnormality determination unit that performs an abnormality determination process of determining that the light-receiving element is abnormal when the number of pulse signals output from the light-receiving element operated under the test voltage is equal to or greater than a predetermined threshold, and determining that the light-receiving element is normal when the number of pulse signals is smaller than the threshold, wherein
the abnormality determination unit measures an operating time of the light-receiving element, and
at least one of the test voltage and the threshold is changed in accordance with the measured operating time.

2. The optical detector according to claim 1, wherein the abnormality determination unit deactivates the light-receiving element that has been determined as abnormal in the abnormality determination process.

3. The optical detector according to claim 1, wherein the abnormality determination unit decreases sensitivity of the light-receiving element that has been determined as abnormal in the abnormality determination process.

4. The optical detector according to claim 1, further comprising a temperature measurement unit that measures a temperature, wherein
at least one of the test voltage and the threshold is changed in accordance with the measured temperature.

5. The optical detector according to claim 1, further comprising a light-receiving unit having a plurality of light-receiving elements, wherein
the abnormality determination unit performs the abnormality determination process on each of the light-receiving elements.

6. The optical detector according to claim 5, wherein the abnormality determination unit further performs the abnormality determination process on individual light-receiving elements included in the light-receiving unit that has been determined as abnormal in the abnormality determination process.

7. A method for controlling an optical detector, comprising:
applying a test voltage lower than a predetermined breakdown voltage to a light-receiving element that is operated in a Geiger mode by application of a service voltage higher than the breakdown voltage and outputs a pulse signal in accordance with reception of light; and
determining that the light-receiving element is abnormal when the number of pulse signals output from the light-receiving element operated under the test voltage is equal to or larger than a predetermined threshold, and determining that the light-receiving element is normal when the number of pulse signals is smaller than the threshold, wherein
an operating time of the light-receiving element is measured, and
at least one of the test voltage and the threshold is changed in accordance with the measured operating time.

* * * * *